US012619168B2

(12) United States Patent
Winters et al.

(10) Patent No.: US 12,619,168 B2
(45) Date of Patent: May 5, 2026

(54) SYSTEMS AND METHODS FOR THERMALLY STABLE MOUNTING OF OPTICAL COLUMNS

(71) Applicant: ASML Netherlands B.V., Veldhoven (NL)

(72) Inventors: Jasper Winters, Nieuw Vennep (NL); Erwin John Van Zwet, Pijnacker (NL); Marcus Johannes Van Der Lans, Hillegom (NL); Pieter Willem Herman De Jager, Middelbeers (NL); Emiel Anton Van De Ven, Delft (NL)

(73) Assignee: ASML Netherlands B.V., Veldhoven (NL)

( * ) Notice: Subject to any disclaimer, the term of this patent is extended or adjusted under 35 U.S.C. 154(b) by 72 days.

(21) Appl. No.: 18/415,586

(22) Filed: Jan. 17, 2024

(65) Prior Publication Data

US 2024/0329548 A1 Oct. 3, 2024

Related U.S. Application Data

(63) Continuation of application No. PCT/EP2022/066594, filed on Jun. 17, 2022.

(30) Foreign Application Priority Data

Jul. 21, 2021 (EP) .................................... 21186947

(51) Int. Cl.
*G03F 7/00* (2006.01)

(52) U.S. Cl.
CPC ...... *G03F 7/70833* (2013.01); *G03F 7/70891* (2013.01); *G03F 7/7095* (2013.01)

(58) Field of Classification Search
CPC .. G03F 7/70808; G03F 7/70833; G03F 7/708; G03F 7/70825; G03F 7/70891;
(Continued)

(56) References Cited

U.S. PATENT DOCUMENTS

| | | | |
|---|---|---|---|
| 5,229,872 A | 7/1993 | Mumola | |
| 6,046,792 A | 4/2000 | Van Der Werf et al. | |

(Continued)

FOREIGN PATENT DOCUMENTS

| | | | | |
|---|---|---|---|---|
| JP | 2005189403 A | * | 7/2005 | |
| JP | 6591916 B2 | | 10/2019 | |
| TW | 201312300 A | | 3/2013 | |

OTHER PUBLICATIONS

Machine translation of JP-2005189403-A (Year: 2005).*
(Continued)

*Primary Examiner* — Steven H Whitesell
(74) *Attorney, Agent, or Firm* — Finnegan, Henderson, Farabow, Garrett & Dunner LLP

(57) ABSTRACT

Systems and methods are disclosed for stabilizing an optical column. One system can include an optical column; a frame configured to support the optical column, the frame having a first coefficient of thermal expansion (CTE); and a sub-frame configured to be coupled to the optical column in at least two places by a first anchor and a second anchor to stabilize the optical column against a displacement or a rotation caused by thermal expansion in the frame or the optical column, the subframe having a second CTE lower than the first CTE.

19 Claims, 13 Drawing Sheets

(58) Field of Classification Search
CPC ............... G03F 7/70883; G03F 7/7095; G03F
7/70975; G03F 7/70275
See application file for complete search history.

(56)                        References Cited

U.S. PATENT DOCUMENTS

| | | | |
|---|---|---|---|
| 6,529,264 B1 | 3/2003 | Ikeda | |
| 7,587,704 B2 | 9/2009 | Ye et al. | |
| 2006/0001855 A1* | 1/2006 | Lof ..................... | G03F 7/70275 |
| | | | 355/53 |
| 2006/0077368 A1* | 4/2006 | Iwata ...................... | G03F 7/709 |
| | | | 355/53 |
| 2007/0146906 A1* | 6/2007 | Kugler ................ | G03F 7/70891 |
| | | | 359/819 |
| 2009/0033895 A1* | 2/2009 | Binnard ............. | G03F 7/70833 |
| | | | 355/53 |

OTHER PUBLICATIONS

PCT International Search Report issued in related PCT Application
No. PCT/EP2022/066594, mailed Oct. 31, 2022 (2 pgs.).

* cited by examiner

810

820

SYSTEMS AND METHODS FOR THERMALLY STABLE MOUNTING OF OPTICAL COLUMNS

CROSS-REFERENCE TO RELATED APPLICATIONS

This application claims priority of International application PCT/EP2022/066594, filed on 17 Jun. 2022, which claims priority of EP application Ser. No. 21/186,947.4, filed on 21 Jul. 2021. These applications are incorporated herein by reference in their entireties.

TECHNICAL FIELD

The description herein relates generally to maskless manufacturing and patterning processes. More particularly, the disclosure includes systems and methods for stabilizing optical columns.

BACKGROUND

A lithographic projection apparatus can be used, for example, in the manufacture of integrated circuits (ICs). In such a case, a patterning device (e.g., a mask) may contain or provide a pattern corresponding to an individual layer of the IC ("design layout"), and this pattern can be transferred onto a target portion (e.g. comprising one or more dies) on a substrate (e.g., silicon wafer) that has been coated with a layer of radiation-sensitive material ("resist"), by methods such as irradiating the target portion through the pattern on the patterning device. In general, a single substrate contains a plurality of adjacent target portions to which the pattern is transferred successively by the lithographic projection apparatus, one target portion at a time. In one type of lithographic projection apparatuses, the pattern on the entire patterning device is transferred onto one target portion in one go; such an apparatus may also be referred to as a stepper. In an alternative apparatus, a step-and-scan apparatus can cause a projection beam to scan over the patterning device in a given reference direction (the "scanning" direction) while synchronously moving the substrate parallel or anti-parallel to this reference direction. Different portions of the pattern on the patterning device are transferred to one target portion progressively. Since, in general, the lithographic projection apparatus will have a reduction ratio M (e.g., 4), the speed F at which the substrate is moved will be 1/M times that at which the projection beam scans the patterning device. More information with regard to lithographic devices can be found in, for example, U.S. Pat. No. 6,046,792, incorporated herein by reference.

Prior to transferring the pattern from the patterning device to the substrate, the substrate may undergo various procedures, such as priming, resist coating and a soft bake. After exposure, the substrate may be subjected to other procedures ("post-exposure procedures"), such as a post-exposure bake (PEB), development, a hard bake and measurement/inspection of the transferred pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

Thus, manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a patterning device in a lithographic apparatus, to transfer a pattern on the patterning device to a substrate and typically, but optionally, involves one or more related pattern processing steps, such as resist development by a development apparatus, baking of the substrate using a bake tool, etching using the pattern using an etch apparatus, etc.

As noted, lithography is a central step in the manufacturing of device such as ICs, where patterns formed on substrates define functional elements of the devices, such as microprocessors, memory chips, etc. Similar lithographic techniques are also used in the formation of flat panel displays, micro-electro mechanical systems (MEMS) and other devices.

As semiconductor manufacturing processes continue to advance, the dimensions of functional elements have continually been reduced while the amount of functional elements, such as transistors, per device has been steadily increasing over decades, following a trend referred to as "Moore's law." At the current state of technology, layers of devices are manufactured using lithographic projection apparatuses that project a design layout onto a substrate using illumination from a deep-ultraviolet illumination source, creating individual functional elements having dimensions well below 100 nm, i.e. less than half the wavelength of the radiation from the illumination source (e.g., a 193 nm illumination source).

This process in which features with dimensions smaller than the classical resolution limit of a lithographic projection apparatus are printed, is can be referred to as low-k1 lithography, according to the resolution formula $CD=k1\times\lambda/NA$, where $\lambda$ is the wavelength of radiation employed (e.g., 248 nm or 193 nm), NA is the numerical aperture of projection optics in the lithographic projection apparatus, CD is the "critical dimension"—generally the smallest feature size printed—and k1 is an empirical resolution factor. In general, the smaller k1 the more difficult it becomes to reproduce a pattern on the substrate that resembles the shape and dimensions planned by a designer in order to achieve particular electrical functionality and performance. To overcome these difficulties, sophisticated fine-tuning steps are applied to the lithographic projection apparatus, the design layout, or the patterning device. These include, for example, but not limited to, optimization of NA and optical coherence settings, customized illumination schemes, use of phase shifting patterning devices, optical proximity correction (OPC, sometimes also referred to as "optical and process correction") in the design layout, or other methods generally defined as "resolution enhancement techniques" (RET). The term "projection optics" as used herein should be broadly interpreted as encompassing various types of optical systems, including refractive optics, reflective optics, apertures and catadioptric optics, for example. The term "projection optics" may also include components operating according to any of these design types for directing, shaping, or controlling the projection beam of radiation, collectively or singularly. The term "projection optics" may include any optical component in the lithographic projection apparatus, no matter where the optical component is located on an optical path of the lithographic projection apparatus. Projection optics may include optical components for shaping, adjusting and/or projecting radiation from the source before the radiation passes the patterning device, and/or optical components for shaping, adjusting and/or projecting the radiation after the radiation passes the patterning device. The projection optics generally exclude the source and the patterning device.

SUMMARY

Systems and methods for stabilizing optical columns against thermal effects are disclosed. In some embodiments of the present disclosure, a system includes an optical column and a frame configured to support the optical column, the frame having a first coefficient of thermal expansion (CTE). The system also includes a subframe configured to be coupled to the optical column in at least two places by a first anchor and a second anchor to stabilize the optical column against a displacement or a rotation caused by thermal expansion in the frame or the optical column. The subframe has a second CTE lower than the first CTE.

In some variations, the optical column can be suspended under a lateral frame section of the frame at a distal end of the optical column and the subframe can be coupled to the optical column at a proximal end of the optical column. The subframe can be coupled to the optical column at approximately a level of a micro-lens array located in the optical column. The frame can be primarily made of steel having a CTE of approximately 14 µm/m/K. The subframe can be primarily made of cordierite having a CTE of approximately 0.03 µm/m/K.

In other variations, the first anchor and the second anchor can be configured to couple to the subframe and the optical column to stabilize the optical column against the displacements in a plane and against the rotation around a longitudinal axis through the optical column perpendicular to the plane. The displacement can be no more than 10 microns meters in a plane and the rotation can be no more than 10 micro-radians around a longitudinal axis through the optical column perpendicular to the plane.

In yet other variations, there may be a number of optical columns and a number of first anchors and a number of second anchors. Each of the first and second anchors can be coupled to a corresponding optical column of the optical columns.

In some variations, first anchor can be configured to stabilize against the displacement of the optical column in at least two directions perpendicular to an axis of the optical column. The first anchor can extend at least partially in a first direction of the two directions and extends at least partially in a second direction of the two directions. The first anchor can be approximately centered on a side of the optical column.

In other variations, the second anchor can be coupled to the optical column at a different location than the first anchor, thereby resisting the rotation of the optical column around a longitudinal axis.

In yet other variations, the subframe can further include a third anchor, where the coupling in the at least two places is performed by the first anchor and further by the third anchor. The first anchor and the third anchor can be coupled to the optical column at a same location. The third anchor can be configured to stabilize against the displacement of the optical column being in at least two directions perpendicular to a longitudinal axis of the optical column, where the third anchor extends at least partially opposite a first direction of the two directions and extends at least partially in a second direction of the two directions. The first anchor, the second anchor, and the third anchor can all be on a side of the subframe.

In some variations, the subframe can include a first lateral subframe section, the first anchor and the second anchor coupled to the first lateral subframe section. The subframe can include a release mechanism allowing disassembly of the first lateral subframe section from a second lateral subframe section of the subframe.

In other variations, the frame can include two frame vertical sections symmetrically located at opposing ends of a lateral frame section to allow positioning of the optical column between them, wherein the subframe is coupled to the two vertical frame sections thereby causing the subframe to be centered with the frame.

In some variations, the subframe can be configured to be coupled to an external body to resist a vertical displacement. The system can include a Z actuator coupled to the optical column and configured to compensate for a vertical displacement of the optical column.

In some embodiments of the present disclosure, a method for stabilizing an optical column against a displacement or a rotation includes supporting an optical column with a frame having a first coefficient of thermal expansion (CTE). The method also includes coupling the optical column to a subframe in at least two places by a first anchor and a second anchor to stabilize the optical column against a displacement or a rotation caused by thermal expansion in the frame or the optical column, the subframe having a second CTE lower than the first CTE.

In some variations, the method can further include utilizing the first anchor and the second anchor to stabilize the optical column against the displacements in a plane and against the rotation around a longitudinal axis through the optical column perpendicular to the plane. The method can further include coupling the subframe to the optical column at approximately a level of a micro-lens array located in the optical column. The method can further include coupling the second anchor to the optical column at a different location than the first anchor, thereby resisting the rotation of the optical column around a longitudinal axis. The method can further include coupling a third anchor to the subframe, wherein the coupling in the at least two places is performed by the first anchor and further by the third anchor.

BRIEF DESCRIPTION OF THE DRAWINGS

The accompanying drawings, which are incorporated in and constitute a part of this specification, show certain aspects of the subject matter disclosed herein and, together with the description, help explain some of the principles associated with the disclosed implementations. In the drawings.

DETAILED DESCRIPTION

Figure 1:
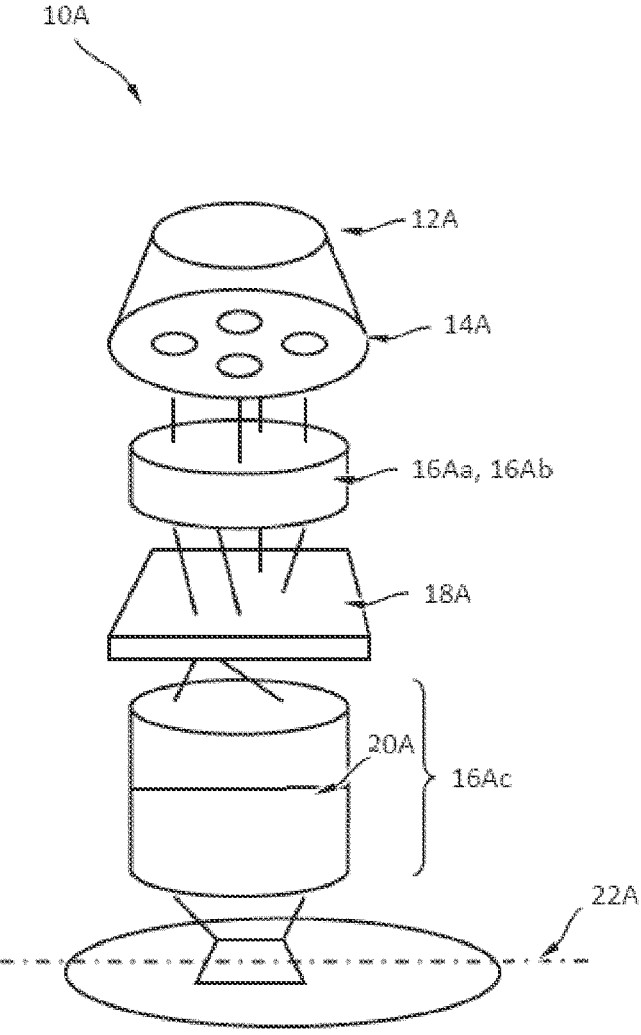
FIG. 1 illustrates a block diagram of various subsystems of a lithographic projection apparatus, according to some embodiments of the present disclosure.

Although specific reference may be made in this text to the manufacture of ICs, it should be explicitly understood that the description herein has many other possible applications. For example, it may be employed in the manufacture of integrated optical systems, guidance and detection patterns for magnetic domain memories, liquid-crystal display panels, flat-panel displays, thin-film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The patterning device can comprise, or can form, one or more design layouts. The design layout can be generated utilizing CAD (computer-aided design) programs, this process often being referred to as EDA (electronic design automation). Most CAD programs follow a set of predetermined design rules in order to create functional design layouts/patterning devices. These rules are set by processing and design limitations. For example, design rules define the space tolerance between devices (such as gates, capacitors, etc.) or interconnect lines, so as to ensure that the devices or lines do not interact with one another in an undesirable way. One or more of the design rule limitations may be referred to as "critical dimension" (CD). A critical dimension of a device can be defined as the smallest width of a line or hole or the smallest space between two lines or two holes. Thus, the CD determines the overall size and density of the designed device. Of course, one of the goals in device fabrication is to faithfully reproduce the original design intent on the substrate (via the patterning device).

The term "mask" or "patterning device" as employed in this text may be broadly interpreted as referring to a generic patterning device that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning devices include a programmable mirror array and a programmable LCD array.

An example of a programmable mirror array can be a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the said undiffracted radiation can be filtered out of the reflected beam, leaving only the diffracted radiation behind; in this manner, the beam becomes patterned according to the addressing pattern of the matrix-addressable surface. The required matrix addressing can be performed using suitable electronic methods.

An example of a programmable LCD array is given in U.S. Pat. No. 5,229,872, which is incorporated herein by reference.

FIG. 1 illustrates a block diagram of various subsystems of a lithographic projection apparatus 10A, according to some embodiments of the present disclosure. Major components are a radiation source 12A, which may be a deep-ultraviolet excimer laser source or other type of source including an extreme ultra violet (EUV) source (as discussed above, the lithographic projection apparatus itself need not have the radiation source), illumination optics which, e.g., define the partial coherence (denoted as sigma) and which may include optics 14A, 16Aa and 16Ab that shape radiation from the source 12A; a patterning device 18A; and transmission optics 16Ac that project an image of the patterning device pattern onto a substrate plane 22A. An adjustable filter or aperture 20A at the pupil plane of the projection optics may restrict the range of beam angles that impinge on the substrate plane 22A, where the largest possible angle defines the numerical aperture of the projection optics NA=n $\sin(\Theta_{max})$, wherein n is the refractive index of the media between the substrate and the last element of the projection optics, and $\Theta_{max}$ is the largest angle of the beam exiting from the projection optics that can still impinge on the substrate plane 22A.

In a lithographic projection apparatus, a source provides illumination (i.e. radiation) to a patterning device and projection optics direct and shape the illumination, via the patterning device, onto a substrate. The projection optics may include at least some of the components 14A, 16Aa, 16Ab and 16Ac. An aerial image (AI) is the radiation intensity distribution at substrate level. A resist model can be used to calculate the resist image from the aerial image, an example of which can be found in U.S. Patent Application Publication No. US 2009-0157630, the disclosure of which is hereby incorporated by reference in its entirety. The resist model is related only to properties of the resist layer (e.g., effects of chemical processes which occur during exposure, post-exposure bake (PEB) and development). Optical properties of the lithographie projection apparatus (e.g., properties of the illumination, the patterning device, and the projection optics) dictate the aerial image and can be defined in an optical model. Since the patterning device used in the lithographic projection apparatus can be changed, it is desirable to separate the optical properties of the patterning device from the optical properties of the rest of the lithographic projection apparatus including at least the source and the projection optics. Details of techniques and models used to transform a design layout into various lithographic images (e.g., an aerial image, a resist image, etc.), apply OPC using those techniques and models and evaluate performance (e.g., in terms of process window) are described in U.S. Patent Application Publication Nos. US 2008-0301620, 2007-0050749, 2007-0031745, 2008-0309897, 2010-0162197, and 2010-0180251, the disclosure of each which is hereby incorporated by reference in its entirety.

One aspect of understanding a lithographic process is understanding the interaction of the radiation and the patterning device. The electromagnetic field of the radiation after the radiation passes the patterning device may be determined from the electromagnetic field of the radiation before the radiation reaches the patterning device and a function that characterizes the interaction. This function may be referred to as the mask transmission function (which can be used to describe the interaction by a transmissive patterning device and/or a reflective patterning device).

The mask transmission function may have a variety of different forms. One form is binary. A binary mask transmission function has either of two values (e.g., zero and a positive constant) at any given location on the patterning device. A mask transmission function in the binary form may be referred to as a binary mask. Another form is continuous. Namely, the modulus of the transmittance (or reflectance) of the patterning device is a continuous function of the location on the patterning device. The phase of the transmittance (or reflectance) may also be a continuous function of the location on the patterning device. A mask transmission function in the continuous form may be referred to as a continuous tone mask or a continuous transmission mask (CTM). For example, the CTM may be represented as a pixelated image, where each pixel may be assigned a value between 0 and 1 (e.g., 0.1, 0.2, 0.3, etc.) instead of binary value of either 0 or 1. In some embodiments, CTM may be a pixelated gray scale image, where each pixel having values (e.g., within a range [−255, 255], normalized values within a range [0, 1] or [−1, 1] or other appropriate ranges).

The thin-mask approximation, also called the Kirchhoff boundary condition, is widely used to simplify the determination of the interaction of the radiation and the patterning device. The thin-mask approximation assumes that the thickness of the structures on the patterning device is very small compared with the wavelength and that the widths of the structures on the mask are very large compared with the wavelength. Therefore, the thin-mask approximation assumes the electromagnetic field after the patterning device is the multiplication of the incident electromagnetic field with the mask transmission function. However, as lithographic processes use radiation of shorter and shorter wavelengths, and the structures on the patterning device become smaller and smaller, the assumption of the thin-mask approximation can break down. For example, interaction of the radiation with the structures (e.g., edges between the top surface and a sidewall) because of their finite thicknesses ("mask 3D effect" or "M3D") may become significant.

Encompassing this scattering in the mask transmission function may enable the mask transmission function to better capture the interaction of the radiation with the patterning device. A mask transmission function under the thin-mask approximation may be referred to as a thin-mask transmission function. A mask transmission function encompassing M3D may be referred to as a M3D mask transmission function.

According to some embodiments of the present disclosure, one or more images may be generated. The images includes various types of signal that may be characterized by pixel values or intensity values of each pixel. Depending on the relative values of the pixel within the image, the signal may be referred as, for example, a weak signal or a strong signal, as may be understood by a person of ordinary skill in the art. The term "strong" and "weak" are relative terms based on intensity values of pixels within an image and specific values of intensity may not limit scope of the present disclosure. In some embodiments, the strong and weak signal may be identified based on a selected threshold value. In some embodiments, the threshold value may be fixed (e.g., a midpoint of a highest intensity and a lowest intensity of pixel within the image). In some embodiments, a strong signal may refer to a signal with values greater than or equal to an average signal value across the image and a weak signal may refer to signal with values less than the average signal value. In some embodiments, the relative intensity value may be based on percentage. For example, the weak signal may be signal having intensity less than 50% of the highest intensity of the pixel (e.g., pixels corresponding to target pattern may be considered pixels with highest intensity) within the image. Furthermore, each pixel within an image may considered as a variable. According to the present example, derivatives or partial derivative may be determined with respect to each pixel within the image and the values of each pixel may be determined or modified according to a cost function based evaluation and/or gradient based computation of the cost function. For example, a CTM image may include pixels, where each pixel is a variable that can take any real value.

Figure 2:
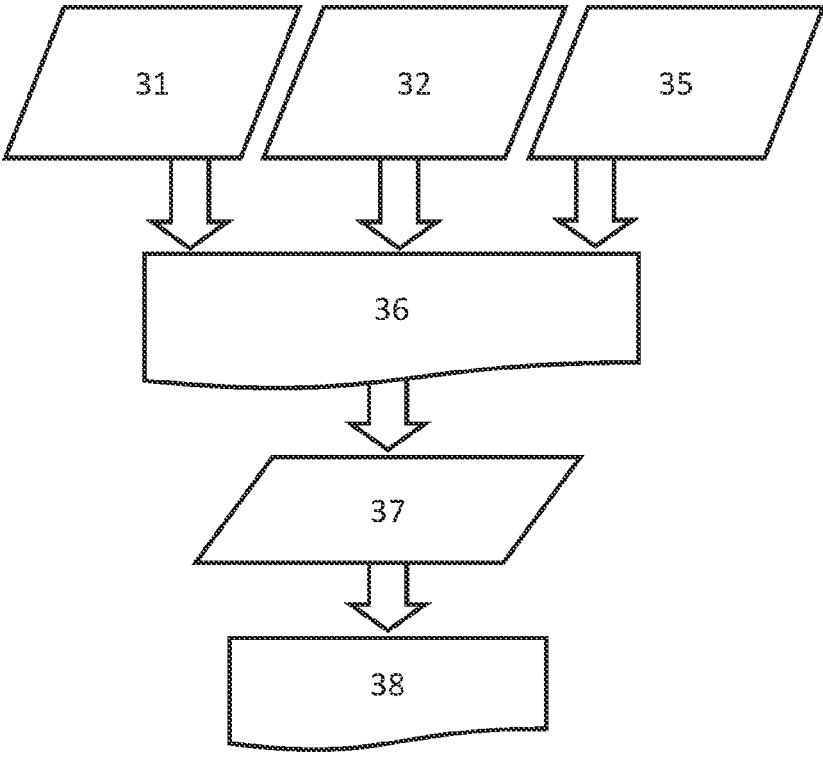
FIG. 2 illustrates an exemplary flow chart for simulating lithography in a lithographic projection apparatus, according to some embodiments of the present disclosure.

FIG. 2 illustrates an exemplary flow chart for simulating lithography in a lithographic projection apparatus, according to some embodiments. Source model 31 represents optical characteristics (including radiation intensity distribution and/or phase distribution) of the source. Projection optics model 32 represents optical characteristics (including changes to the radiation intensity distribution and/or the phase distribution caused by the projection optics) of the projection optics. Design layout model 35 represents optical characteristics of a design layout (including changes to the radiation intensity distribution and/or the phase distribution caused by design layout 33), which is the representation of an arrangement of features on or formed by a patterning device. Aerial image 36 can be simulated from design layout model 35, projection optics model 32, and design layout model 35. Resist image 38 can be simulated from aerial image 36 using resist model 37. Simulation of lithography can, for example, predict contours and CDs in the resist image.

More specifically, it is noted that source model 31 can represent the optical characteristics of the source that include, but not limited to, numerical aperture settings, illumination sigma (σ) settings as well as any particular illumination shape (e.g. off-axis radiation sources such as annular, quadrupole, dipole, etc.). Projection optics model 32 can represent the optical characteristics of the projection optics, including aberration, distortion, one or more refractive indexes, one or more physical sizes, one or more physical dimensions, etc. Design layout model 35 can represent one or more physical properties of a physical patterning device, as described, for example, in U.S. Pat. No. 7,587,704, which is incorporated by reference in its entirety. The objective of the simulation is to accurately predict, for example, edge placement, aerial image intensity slope and/ or CD, which can then be compared against an intended design. The intended design is generally defined as a pre-OPC design layout which can be provided in a standardized digital file format such as GDSII or OASIS or other file format.

From this design layout, one or more portions may be identified, which are referred to as "clips". In some embodiments, a set of clips is extracted, which represents the complicated patterns in the design layout (typically about 50 to 1000 clips, although any number of clips may be used). These patterns or clips represent small portions (i.e. circuits, cells, or patterns) of the design and more specifically, the clips typically represent small portions for which particular attention and/or verification is needed. In other words, clips may be the portions of the design layout, or may be similar or have a similar behavior of portions of the design layout, where one or more critical features are identified either by experience (including clips provided by a customer), by trial and error, or by running a full-chip simulation. Clips may contain one or more test patterns or gauge patterns.

An initial larger set of clips may be provided a priori by a customer based on one or more known critical feature areas in a design layout which require particular image optimization. Alternatively, in another example, an initial larger set of clips may be extracted from the entire design layout by using some kind of automated (such as machine vision) or manual algorithm that identifies the one or more critical feature areas.

In a lithographic projection apparatus, as an example, a cost function may be expressed as $$CF(z_1, z_2, \ldots, z_N) = \sum_{p=1}^{P} w_p f_p^2(z_1, z_2, \ldots, z_N) \qquad \text{(Eq. 1)}$$

where $(z_1, z_2, \ldots, z_N)$ are N design variables or values thereof. $f_p(z_1, z_2, \ldots, z_N)$ can be a function of the design variables $(z_1, z_2, \ldots, z_N)$ such as a difference between an actual value and an intended value of a characteristic for a set of values of the design variables of $(z_1, z_2, \ldots, z_N)$. $w_p$ is a weight constant associated with $f_p(z_1, z_2, \ldots, z_N)$. For example, the characteristic may be a position of an edge of a pattern, measured at a given point on the edge. Different $f_p(z_1, z_2, \ldots, z_N)$ may have different weight $w_p$. For example, if a particular edge has a narrow range of permitted positions, the weight $w_p$ for the $f_p(z_1, z_2, \ldots, z_N)$ representing the difference between the actual position and the intended position of the edge may be given a higher value. $f_p(z_1, z_2, \ldots, z_N)$ can also be a function of an interlayer characteristic, which is in turn a function of the design variables $(z_1, z_2, \ldots, z_N)$. Of course, CF $(z_1, z_2, \ldots, z_N)$ is not limited to the form in Eq. 1. CF $(z_1, z_2, \ldots, z_N)$ can be in any other suitable form.

The cost function may represent any one or more suitable characteristics of the lithographic projection apparatus, lithographic process, or the substrate, for instance, focus, CD, image shift, image distortion, image rotation, stochastic variation, throughput, local CD variation, process window, an interlayer characteristic, or a combination thereof. In one example, the design variables $(z_1, z_2, \ldots, z_N)$ comprise one or more selected from dose, global bias of the patterning device, and/or shape of illumination. Since it is the resist image that often dictates the pattern on a substrate, the cost function may include a function that represents one or more characteristics of the resist image. For example, $f_p(z_1, z_2, \ldots, z_N)$ can be simply a distance between a point in the resist image to an intended position of that point (i.e., edge placement error $\text{EPE}_p(z_1, z_2, \ldots, z_N)$). The design variables can include any adjustable parameter such as an adjustable parameter of the source, the patterning device, the projection optics, dose, focus, etc.

The lithographic apparatus may include components collectively called a "wavefront manipulator" that can be used to adjust the shape of a wavefront and intensity distribution and/or phase shift of a radiation beam. In some embodiments, the lithographic apparatus can adjust a wavefront and intensity distribution at any location along an optical path of the lithographic projection apparatus, such as before the patterning device, near a pupil plane, near an image plane, and/or near a focal plane. The wavefront manipulator can be used to correct or compensate for certain distortions of the wavefront and intensity distribution and/or phase shift caused by, for example, the source, the patterning device, temperature variation in the lithographic projection apparatus, thermal expansion of components of the lithographic projection apparatus, etc. Adjusting the wavefront and intensity distribution and/or phase shift can change values of the characteristics represented by the cost function. Such changes can be simulated from a model or actually measured. The design variables can include parameters of the wavefront manipulator.

The design variables may have constraints, which can be expressed as $(z_1, z_2, \ldots, z_N) \in Z$, where Z is a set of possible values of the design variables. One possible constraint on the design variables may be imposed by a desired throughput of the lithographic projection apparatus. Without such a constraint imposed by the desired throughput, the optimization may yield a set of values of the design variables that are unrealistic. For example, if the dose is a design variable, without such a constraint, the optimization may yield a dose value that makes the throughput economically impossible. However, the usefulness of constraints should not be interpreted as a necessity. For example, the throughput may be affected by the pupil fill ratio. For some illumination designs, a low pupil fill ratio may discard radiation, leading to lower throughput. Throughput may also be affected by the resist chemistry. Slower resist (e.g., a resist that requires higher amount of radiation to be properly exposed) leads to lower throughput.

As used herein, the term "patterning process" means a process that creates an etched substrate by the application of specified patterns of light as part of a lithography process.

As used herein, the term "target pattern" means an idealized pattern that is to be etched on a substrate.

As used herein, the term "printed pattern" means the physical pattern on a substrate that was etched based on a target pattern. The printed pattern can include, for example, troughs, channels, depressions, edges, or other two and three dimensional features resulting from a lithography process.

As used herein, the term "process model" means a model that includes one or more models that simulate a patterning process. For example, a process model can include any combination of: an optical model (e.g., that models a lens system/projection system used to deliver light in a lithography process and may include modelling the final optical image of light that goes onto a photoresist), a resist model (e.g., that models physical effects of the resist, such as chemical effects due to the light), an OPC model (e.g., that can be used to make target patterns and may include sub-resolution resist features (SRAFs), etc.), an imaging device model (e.g., that models what an imaging device may image from a printed pattern).

As used herein, the term "imaging device" means any number or combination of devices and associated computer hardware and software that can be configured to generate images of a target, such as the printed pattern or portions thereof. Non-limiting examples of an imaging devices can include: scanning electron microscopes (SEMs), x-ray machines, etc.

As used herein, the term "calibrating" means to modify (e.g., improve or tune) and/or validate something, such as the process model.

Figure 3:
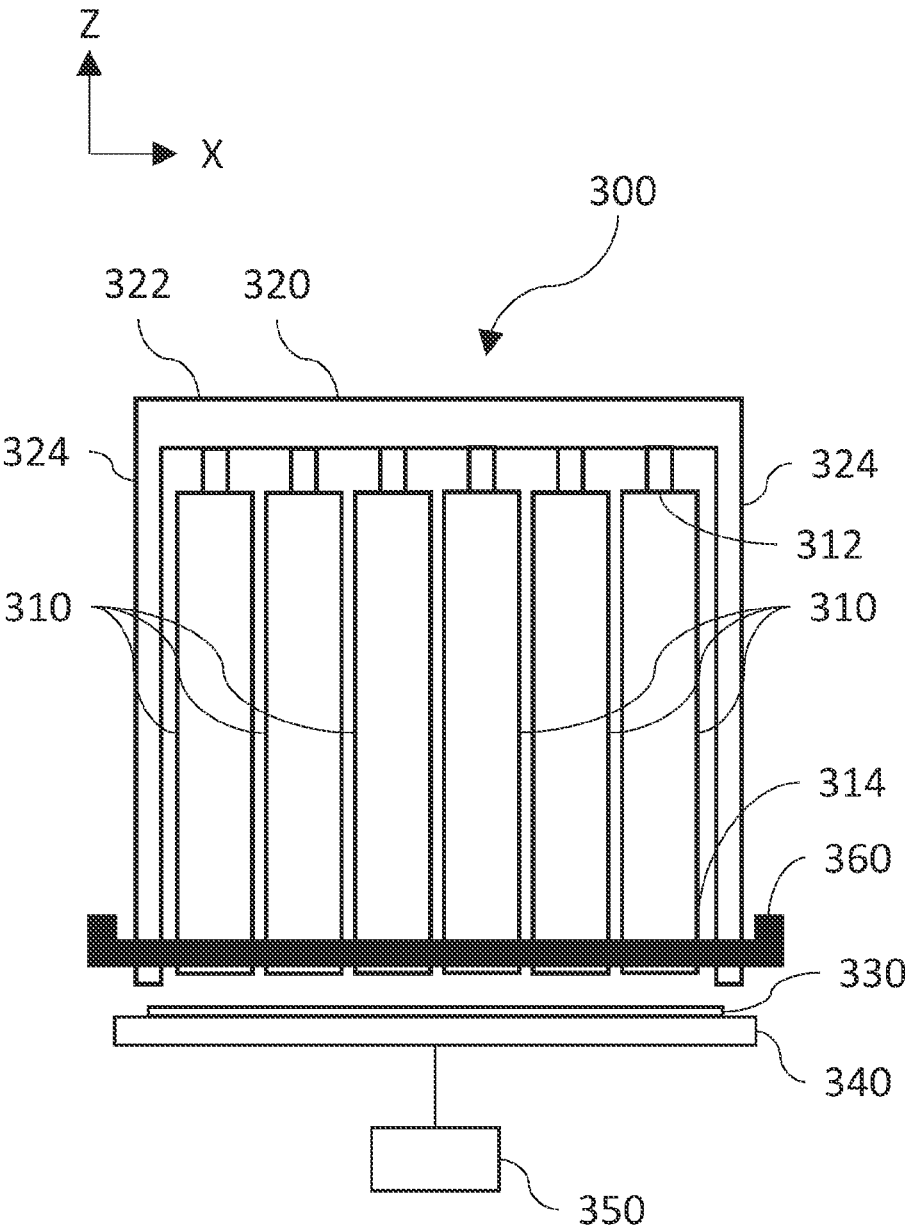
FIG. 3 illustrates optical columns supported by a frame and stabilized by a subframe, according to some embodiments of the present disclosure.
Figure 4:
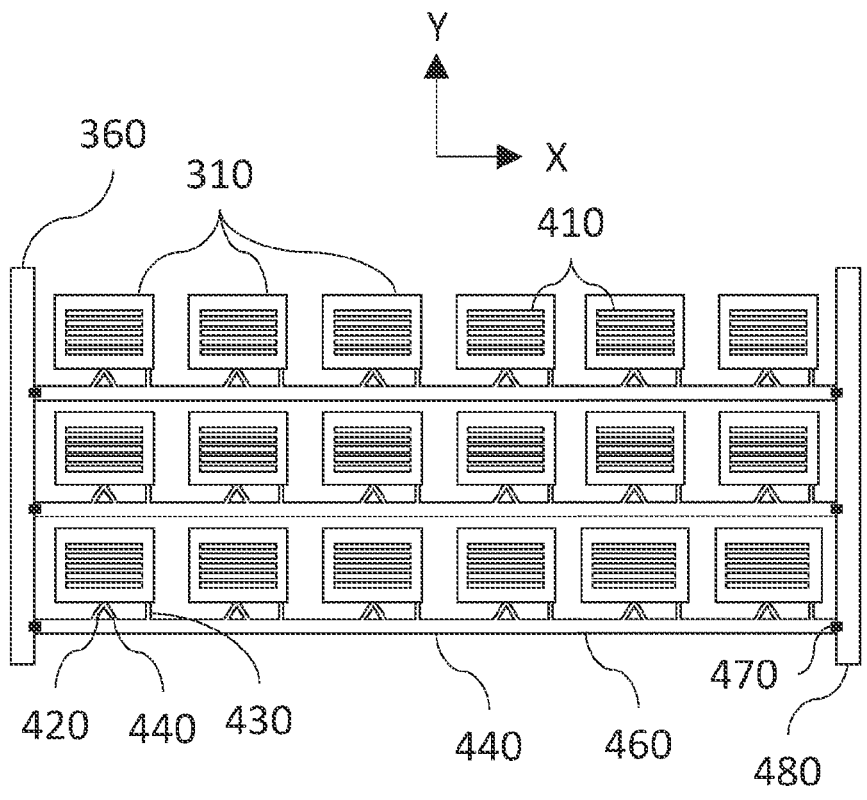
FIG. 4 illustrates a bottom view of FIG. 3 depicting anchors of the subframe, according to some embodiments of the present disclosure.

FIG. 3 illustrates optical columns supported by a frame and stabilized by a subframe, according to some embodiments. FIG. 4 illustrates a bottom view of FIG. 3 depicting anchors of the subframe, according to some embodiments. For high precision lithographic processes it can be necessary to stabilize components against unacceptable displacements or rotations that could introduce errors into the lithographic process. For example, temperature variations can cause expansion or contraction in one or more dimensions of various components in what is referred to as the "optical column." The optical column may include components such as a micro-lens array, focusing optics, digital mirror device, etc. which may be arranged substantially along an axis to form a "column." The exemplary lithographie apparatus 10A depicted in FIG. 1 is one example of an optical column. However, it is understood that any optical column may contain different components that any components may be different positions. Thermal expansions/contractions can thus cause optical components in the optical column to be displaced or rotated such that they are not in a desired position. The present disclosure thus provides numerous embodiments to stabilize components in the optical column.

For example, the position of the optical column can be stabilized with respect to a certain machine reference (e.g., a metrology frame or a coordinate system). By stabilizing the position of the optical column in a "stress free" way, no (or very limited) stresses are introduced in the optical column, meaning the internal components of the column also stay in place. Some mounting apparatuses described herein can constrain six degrees of freedom (3 translations, 3 rotations), thus the system can be constrained but not over-constrained. As such, certain embodiments described herein can utilize six struts, one for each degree of freedom. The stabilization of the components of the optical column can also be accomplished by mechanically stabilizing the particular component of the optical column that has the lowest amount of permittable translations/rotations (e.g., the MLA). As described herein, this can include positioning subframes/anchors to be at a shortest possible mechanical distance from the particular component. While the present disclosure primarily addresses displacements and rotations caused due to thermal effects, the embodiments described herein can also provide stabilization against similar displacements and rotations due to other causes, for example, mechanical strain, vibration, airflow, etc.

As depicted in FIG. 3, one example of a system 300 can include an optical column 310 and a frame 320 configured to support the optical column 310. In some embodiments, the optical column can have its various components suspended (e.g., hanging) from the frame over substrate 330 that is receiving light from the lithographic components. As also depicted in FIG. 3, substrate 330 may be supported by a stage 340 (which in some embodiments may also be a metroframe) that can be moved in up to three dimensions by actuator 350. In this way, substrate 330 can be moved beneath the optical columns in order to facilitate the delivery of light as to the substrate in the desired locations to create the desired printed pattern.

As opposed to such "hanging" embodiments above, it is contemplated that other embodiments can be implemented where the system is at a different orientation (e.g., horizontal). Thus, while much of the disclosure herein is provided with reference to a particular coordinate system (e.g., X, Y, Z), such should not be exclusively interpreted as the Z direction being vertical, etc. Similarly, for purposes of explanation, in some cases a direction will be referred to as positive or negative (e.g., +X or –X), but again such constructions are merely for purposes of explanation and therefore should not imply any particular orientation of the disclosed systems beyond what is disclosed or what would be understood by a person of skill in light of the disclosure.

As shown in the example of FIG. 3, the optical column(s) can be suspended under a lateral frame section 322 of the frame at a distal end 312 of the optical column. Also depicted is that the subframe can be coupled to the optical column at a proximal end 314 of the optical column. As used herein, the term "distal end" refers to the end of the optical column furthest from the substrate. Similarly, the term "proximal end" refers to the end of the optical column closest to the substrate. However, it is understood that the term "end" does not mean the extreme end of the optical column but rather the general region around the respective end. Thus, for example, the respective "end" can include up to the last 40% of the optical column, but in other embodiments may include up to the last 30%, 20%, or 10% of the optical column.

In accordance with the general disclosure relating to addressing the technical problem of unwanted thermal expansions, certain elements are described with reference to their thermal properties. For example, in some embodiments, the frame may have a first coefficient of thermal expansion (CTE). The CTE may be material dependent and thus examples of materials may be used with various embodiments are disclosed. For example, in one example, the frame may be primarily made of steel having a CTE of approximately 14 μm/m/K. As used herein, the description of a component being "primarily made of" particular material means that at least a majority of the component is made of the specified material. However, this also discloses that it is possible for the frame to include components that are made of different materials. For example, the steel frame may have portions that are iron, plastic, aluminum, etc. and thus may have different CTEs. Accordingly, while the present disclosure often presents simplified explanations where a given component (e.g., the frame or subframe) is considered to be made out of a material having a particular CTE, is understood that actual limitations may involve combinations of materials having different CTEs. Thus, the present disclosure expressly contemplates embodiments covered by the more general concept that the frame has a particular (overall) CTE, and the subframe has a different (overall) CTE, as described herein.

FIG. 4 is a simplified bottom view of portions of the system illustrated in FIG. 3. For example, depicted in the bottom view of FIG. 4 into the optical columns 310 are examples of micro-lens arrays 410 that may be contained in any or all of the optical columns 310.

In some embodiments, the stabilization can be improved by the subframe having a second CTE lower than the first CTE (of the frame 310). For example, in certain implementations, the subframe can be primarily made of cordierite having a CTE of approximately 0.03 μm/m/K. In other implementations, portions of the subframe and/or any of the anchors disclosed herein may be primarily made of zerodur (CTE~0.007 μm/m/K) or invar (CTE~1.2 μm/m/K). Examples of "primarily of" can include embodiments where the subframe and/or anchors are made of at least 60%. 70%, 80%, 90%, 95%, or 100% the low CTE material. While it is contemplated that constructing the subframe and/or anchors "primarily of" a particular low CTE material facilitates realizing its mechanical benefits, is understood that other materials (including combinations of low CTE materials) may be utilized in the construction of the subframe and/or anchors. Accordingly, in some implementations, the construction may alternatively be formulated in terms of the overall CTE. For example, in some implementations, a primarily zerodur subframe may be configured to have an overall CTE of approximately 0.007 μm/m/K, thus allowing for the presence of some components that may have higher or lower CTE. In this way, the present disclosure contemplates that the subframe may be configured via a combination of material properties and anchor types/locations to provide stabilization against thermal effects. While the above example materials are well suited for providing improved stabilization, such are considered examples and many other low CTE materials may be utilized to provide the technical benefits disclosed herein.

As explained further herein, certain implementations may utilize the fact that it may not be necessary to provide full stabilization of the optical column against every possible rotation and/or displacement. Similarly, in some embodiments, there may be locations along the optical column that may be considered more important to stabilize. As shown in FIG. 4, certain implementations of the subframe may be coupled to the optical column at approximately a level of a micro-lens array located in the optical column. Such may be particularly important considering that the micro-lens array may be the last optic before the delivery of light to the substrate and thus be considered a critical component to stabilize. In other implementations, the very bottom of the optical column (at the proximal end) or the center of the optical column (along the column axis) may be where the subframe is located.

FIG. 4 also shows an example of subframe 360 including first anchors 420 and second anchors 430 being utilized to stabilize a number of optical columns 310. In the depicted example, there are six optical columns on each of the depicted three rows. However, it is understood that number of optical columns and their distribution in any number of rows is arbitrary and that the embodiments depicted are merely examples. Thus, as depicted in the example of FIG. 4, the present disclosure allows for a number of optical columns and thus a number of first anchors and second anchors, each of the first and second anchors coupled to a corresponding optical column in the group of optical columns.

In some embodiments, the subframe can be configured to allow disassembly in a way that provides a minimum disturbance to the delicate and precisely positioned optical columns. For example, the subframe can include a first lateral subframe section 460 (e.g., the elongate portion extending in the X direction). The first anchor and the second anchor can be coupled to the first lateral subframe section, thus placing the anchors conveniently on one side of the optical column. In FIG. 4, only one first lateral subframe section 460 is labelled, but it is apparent from the drawing that there can be multiple such lateral subframe sections, for example, one for each row of optical columns. To further facilitate disassembly of the subframe, some embodiments may further include a release mechanism 470 allowing disassembly of the first lateral section 460 from a second lateral subframe section 480 of the subframe. Examples of release mechanisms can include, pins, magnetic couplers, threaded bolts, etc. As shown in the example of FIG. 4, the second lateral subframe section 480 can be perpendicular (e.g., in the Y direction) to the first lateral subframe section 460.

In the example of FIG. 4, a subframe can be configured to be coupled to the optical column in at least two places by a first anchor 420 and a second anchor 430. This configuration can thus stabilize the optical column against a displacement and/or a rotation caused by thermal expansion in the frame or the optical column. As used herein, the term "displacement" refers to linear motion (e.g., X, Y. or Z). As used herein, the term "rotation" refers to angular motion about an axis X, Y, or Z and may be denoted as (Rx, Ry, or Rz).

In some embodiments, the first anchor and the second anchor can be configured to couple to the subframe and the optical column to stabilize the optical column against the displacements in a plane (e.g., the X-Y plane as indicated in FIG. 4) and/or against the rotation around a longitudinal axis (e.g., along a Z axis, as indicated in FIG. 3) through the optical column perpendicular to the plane. In some embodiments, such stabilization can cause the system to permit displacements no more than 10 microns meters in a plane. In other implementations, the system can stabilize against significantly smaller displacements such as, for example, less than 300 nm, less than 200 nm, less than 160 nm, less than 120 nm, etc. Similarly, some embodiments can provide stabilization such that the rotation is no more than 10 micro-radians around a longitudinal axis through the optical column perpendicular to the plane. In other implementations, the system can stabilize against significantly smaller rotations such as, for example, less than 1000 nrad (nano-radians), less than 750 nrad, less than 500 nrad, less than 200 nrad, etc.

While the present disclosure contemplates stabilizing any of the degrees of freedom (e.g., X, Y, Z, Rx, Ry, Rz) of the optical column, in certain embodiments it may be beneficial to stabilize only certain degrees of freedom that are most important for accurate delivery of light by the optical column. Such selective stabilization can thus provide numerous technical benefits while reducing the overall complexity of the system as compared to the embodiments where all degrees of freedom are stabilized. For example, one disclosed combination of stabilized degrees of freedom can include, X. Y, and Rz. Exemplary embodiments of anchoring to provide such stabilization are described further herein. However, other combinations of stabilized degrees of freedom can include, for example, (X, Y, Z, and Rz) or (Y and Rz).

The disclosed anchoring systems can provide stabilization of a number of different degrees of freedom. For example, in some implementations, the first anchor 420 can be configured to stabilize against the displacement of the optical column in at least two directions perpendicular (e.g., X and Y) to an axis (e.g., Z) of the optical column. Such stabilization can be realized by the first anchor extending at least partially in a first direction (e.g., X) of the two directions and extending at least partially in a second direction (e.g., Y) of the two directions. Such a design can be seen in the example in FIG. 4 where first anchor 420 is at an angle relative to both the X and Y axis. While the first anchor can be at any location relative to the optical column, in the example of FIG. 4, the first anchor is approximately centered on a side of the optical column. As used herein, the term "approximately centered" means within 30% (of the length of a side the optical column) from the center of the side of the optical column. However, it is also apparent from FIG. 4 that the present disclosure contemplates the connection of the anchor and the optical column to very nearly at the center of the side of the optical column (e.g., ±5%). As used herein, an "anchor" can be any component capable of securing two things (e.g., securing the elongate lateral section of the subframe to the optical column, or securing the frame to the optical column). Examples of anchors can include rods, trusses, bars, beams, struts, etc.

In some implementations, there may be a second anchor 430 coupled to the optical column at a different location than the first anchor, thereby resisting the rotation of the optical column around a longitudinal axis (e.g., the Z axis). It can be seen that the off-center location of second anchor 430 opposes any rotation (Rz) along the axis of the optical column. Additionally, the presence of only one anchor (e.g., first anchor 420) could provide a pivot point for the optical column at the location where the first anchor is coupled to the optical. To prevent such, second anchor 430 can be provided to resist the rotation (as second anchor 430 would have to be compressed or stretched to allow said rotation). While the second anchor may be located at any location along the side of the optical column, in certain implementations such as that shown in FIG. 4 the second anchor may be located near the end of the side of the optical column. Such positions can provide mechanical advantage due to the longer lever arm that provides oppositional torque to rotation of the optical column.

As shown in FIG. 4, some embodiments of the subframe can include a third anchor 440. In this way, the coupling in the at least two places can be performed by the first anchor and further by the third anchor. The example of FIG. 4, the first anchor and the third anchor can be coupled to the optical column at a same location (e.g., forming the depicted triangular or "V"-shaped assembly). The third anchor can be configured to stabilize against the displacement of the optical column in at least two directions perpendicular to a longitudinal axis of the optical column. This can be realized by certain embodiments where the third anchor extends at least partially opposite a first direction (e.g., −X) of the two directions and extends at least partially in a second direction of the two directions (e.g., +Y). Thus, the first anchor and the second anchor can stabilize a X'-Y' plane that is under the same offset angle to the X-Y plane. The offset angle between X'-Y' and X-Y is the same as the angle of the anchors with respect to the X-Y plane. The result is however the same since the mathematically spanned plane of X'-Y' is the same as X-Y. As depicted, the first anchor, the second anchor, and the third anchor can all be on a side of the subframe. However, in other embodiments, any of the disclosed anchors may be located on any of the sides of the subframe where they may perform substantially the same mechanical stabilization.

Figure 5:
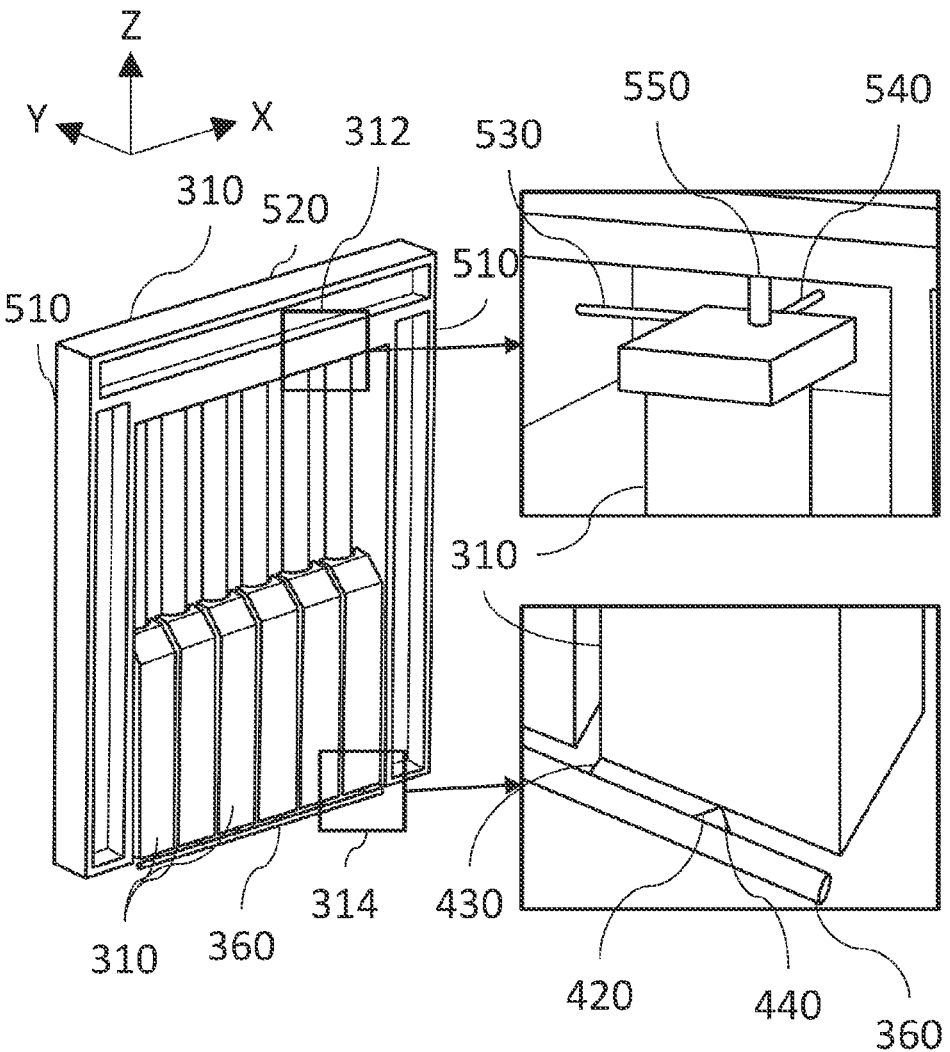
FIG. 5 includes perspective views that illustrate stabilization at the ends of the optical columns, according to some embodiments of the present disclosure.

FIG. 5 includes perspective views that illustrate stabilization at the ends of the optical columns, according to some embodiments. As depicted in the implementation of FIG. 5, the frame may include two frame vertical sections 510 symmetrically located at opposing ends of a lateral frame section 520 to allow positioning of the optical columns between them. Also, the subframe can be coupled to the two vertical frame portions thereby causing the subframe to be centered with the frame. The inset views of FIG. 5 depict one example of combinations of stabilization methods disposed at the proximal and distal ends of the optical columns.

In some embodiments, there may be stabilization at the distal end 312 of the optical column. For example, the top inset of FIG. 5 shows that there can be an X stabilizer 530 and/or a Y stabilizer 540. Such stabilizers may be similar to the anchors described herein and thus be rods, struts, or other sorts of mechanical braces. As such stabilizers are generally considered to be part of the frame, it is contemplated that most embodiments may have the stabilizers constructed of similar materials as the frame (e.g., not low CTE material used for the subframe). As also shown in the top inset, other embodiments can include a Z stabilizer 550. While the Z stabilizer may be similar to the X and/or Y stabilizers, in some embodiments the Z stabilizer may also include a Z actuator coupled to the optical column and configured to compensate for a vertical displacement of the optical column. The Z actuator may be a hydraulic, pneumatic actuator, screw, differential thread, piezoelectric actuator, a stepper motor-based actuator, linear motor, voice coil actuator, thermal actuator, harmonic drive actuator, etc. For example, either via temperature monitoring or by measurement of mechanical displacements, expansions and/or contractions in the Z direction can be compensated by a corresponding opposing adjustment of the Z actuator. Additionally, it is contemplated that in certain embodiments, the X and/or Y stabilizers may also include X and/or Y actuators configured to operate similar to the Z actuator to compensate for X and/or Y displacements.

Also depicted in the bottom inset of FIG. 5, are previously illustrated examples of first anchor 420, second anchor 430, and third anchor 440, that couple the optical column to subframe 360. In certain embodiments, the subframe 360 can be configured to be coupled to an external body to resist a vertical displacement. For example, the subframe can be connected to the lower portion of the frame, but additionally or alternatively may be connected to another body such as an overall support, nearby walls, floors, or ceilings of the room where the lithography system is located, etc. While this may provide additional mechanical stabilization, such coupling to external bodies can aid in providing a heat sink or thermal inertia for any heat arriving at the subframe.

In some implementations, rather than the subframe primarily comprising low CTE material, the subframe may be constructed of higher CTE material similar to the frame. In such embodiments, temperature control may be utilized to maintain the mechanical dimensions of the subframe. For example, the system may include a direct cooling system to maintain a physical configuration of the anchors against changes in temperature. A direct cooling system is understood to be a system that provides a coolant directly to the subframe. For example, having subframe be at least partially hollow and providing liquid coolants such as water through the subframe to extract heat. In other embodiments, the system may include an indirect cooling system. Examples of indirect cooling systems can include chilled air blowing over the subframe, fins or other physical attachments that increase the surface area of the subframe to radiate heat, etc.

Figure 6:
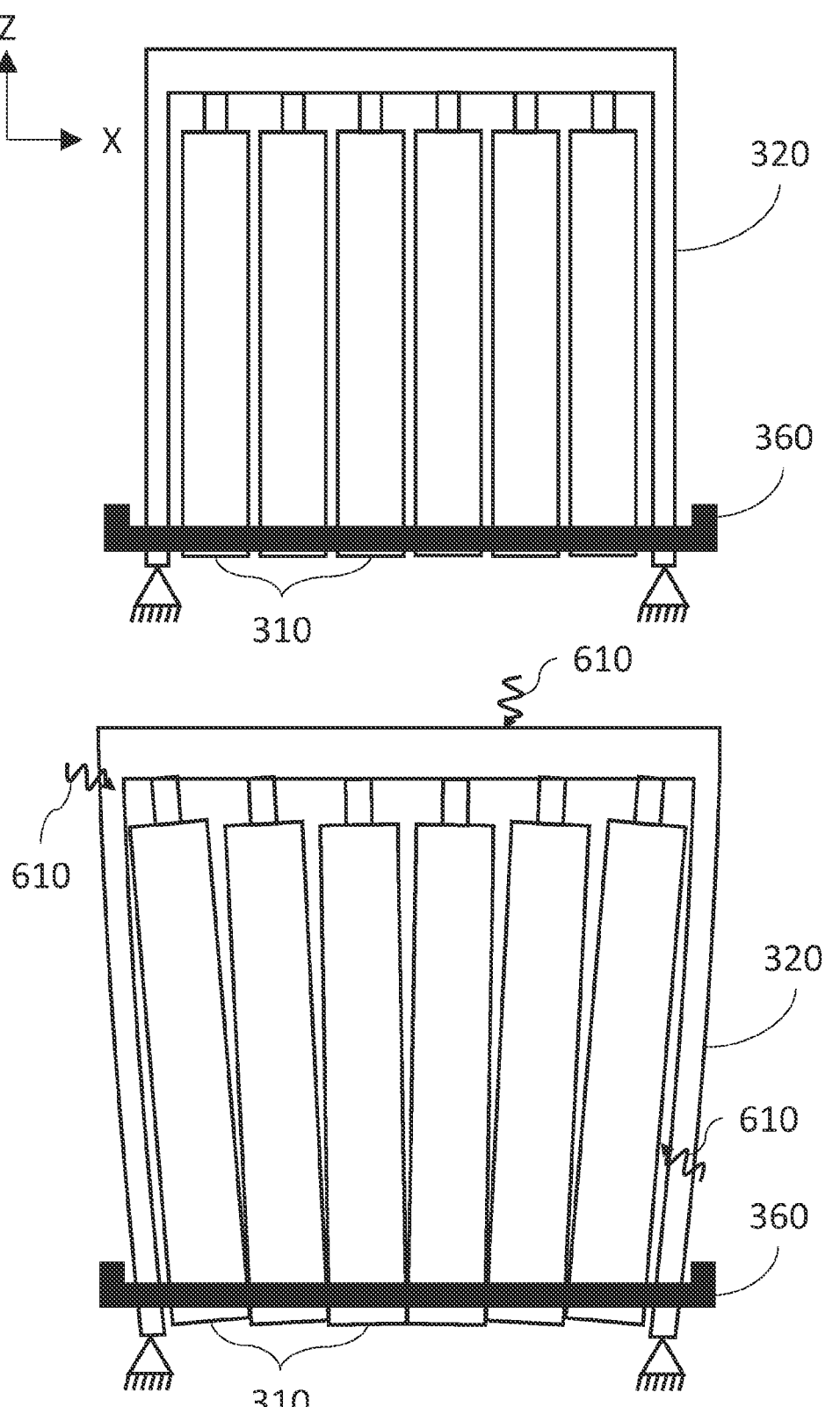
FIG. 6 illustrates an exaggerated example the subframe stabilizing against displacements and rotations that may occur in the disclosed system, according to some embodiments of the present disclosure.
Figure 7:
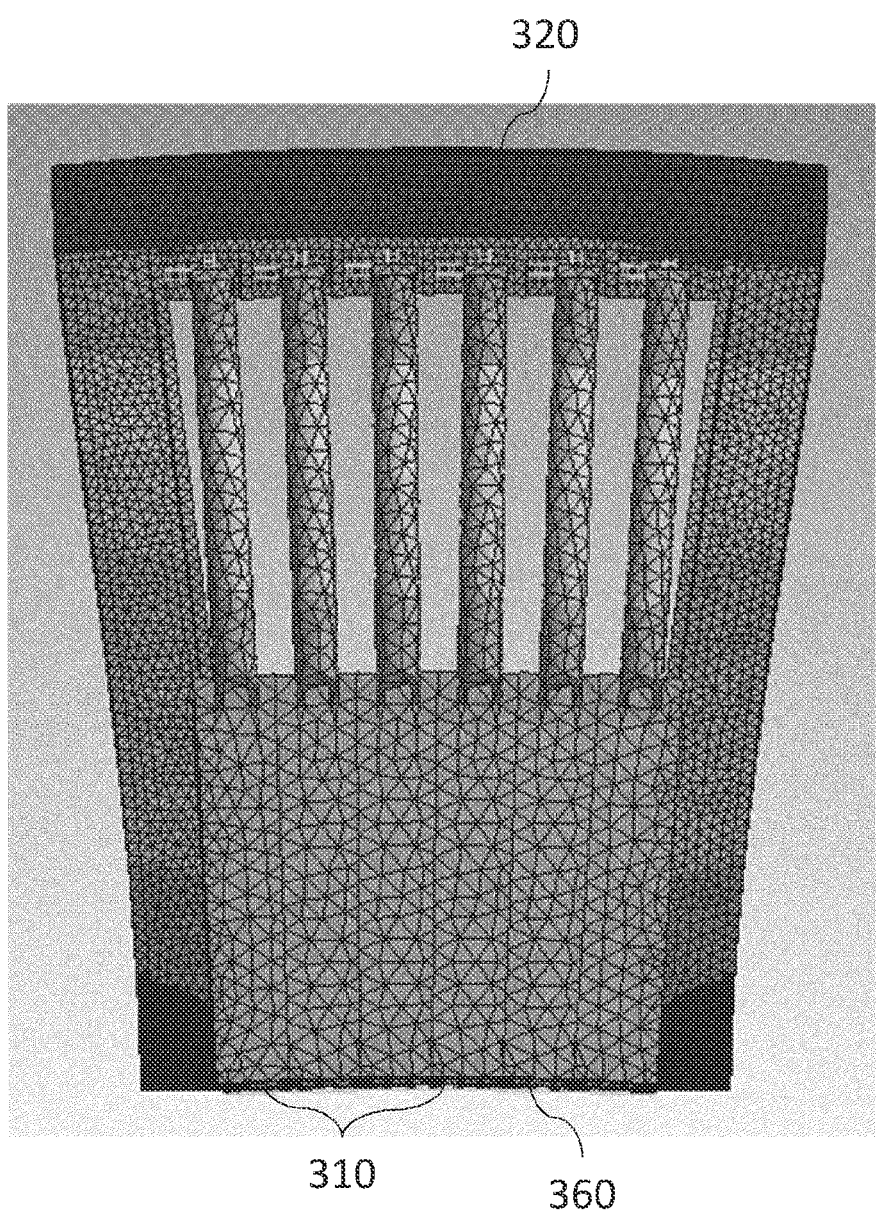
FIG. 7 illustrates an example finite element analysis performed to simulate changes in the frame and optical column due to thermal effects, according to some embodiments of the present disclosure.

FIG. 6 illustrates an exaggerated example the subframe stabilizing against displacements and rotations that may occur in the disclosed system, according to some embodiments. FIG. 7 illustrates an example finite element analysis performed to simulate changes in the frame and optical column due to thermal effects, according to some embodiments. The top portion of FIG. 6 is an example of the system in a nominal configuration (i.e., without displacements and/or rotations). The bottom portion of FIG. 6 is an example where heat 610 arriving at the system causing the comparatively high CTE frame 322 expand. As seen, this results in the depicted displacement in X of optical columns 310 (greatly exaggerated for illustrative purposes). However, it is seen that the low CTE subframe 360 constrains X displacement of the optical columns near the bottom of the optical column (e.g., near the location of the micro-lens array). As previously described, further stabilization can include, for example, utilization of the Z actuator to compensate for the changes in the length of the optical column and/or a change in the linear distance between the top of the optical column (attached to the expanded frame) and the desired location of the micro-lens array. Thermal effects on the disclosed systems have been thoroughly studied with one example of a finite element analysis depicted in FIG. 7. Here, frame 320 and optical columns 310 are shown with again exaggerated thermal effects. The simulated subframe 360 is shown by the darker portion at the bottom of the figure.

Figure 8:
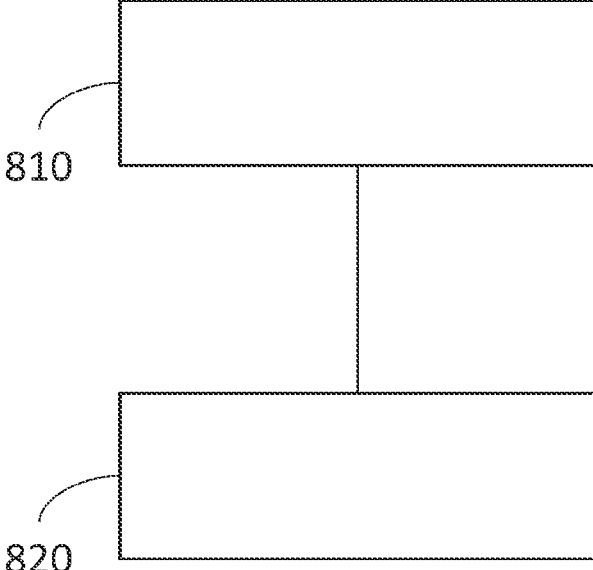
FIG. 8 illustrates a process flow diagram depicting an exemplary method for stabilizing an optical column, according to some embodiments of the present disclosure.

FIG. 8 illustrates a process flow diagram depicting an exemplary method for stabilizing an optical column, according to some embodiments. A method for stabilizing an optical column against a displacement or a rotation can include, at 810 supporting an optical column with a frame having a first coefficient of thermal expansion (CTE). At 820 the method may also include coupling the optical column to a subframe in at least two places by a first anchor and a second anchor to stabilize the optical column against a displacement or a rotation caused by thermal expansion in the frame or the optical column, the subframe having a second CTE lower than the first CTE.

In other implementations, the method may further include the following features, in any combination. The method may include utilizing the first anchor and the second anchor to stabilize the optical column against the displacements in a plane and against the rotation around a longitudinal axis through the optical column perpendicular to the plane. The subframe may be coupled to the optical column at approximately a level of a micro-lens array located in the optical column. The second anchor may be coupled to the optical column at a different location than the first anchor, thereby resisting the rotation of the optical column around a longitudinal axis. A third anchor may be coupled to the subframe such that the coupling in the at least two places can be performed by the first anchor and further by the third anchor.

Figure 9:
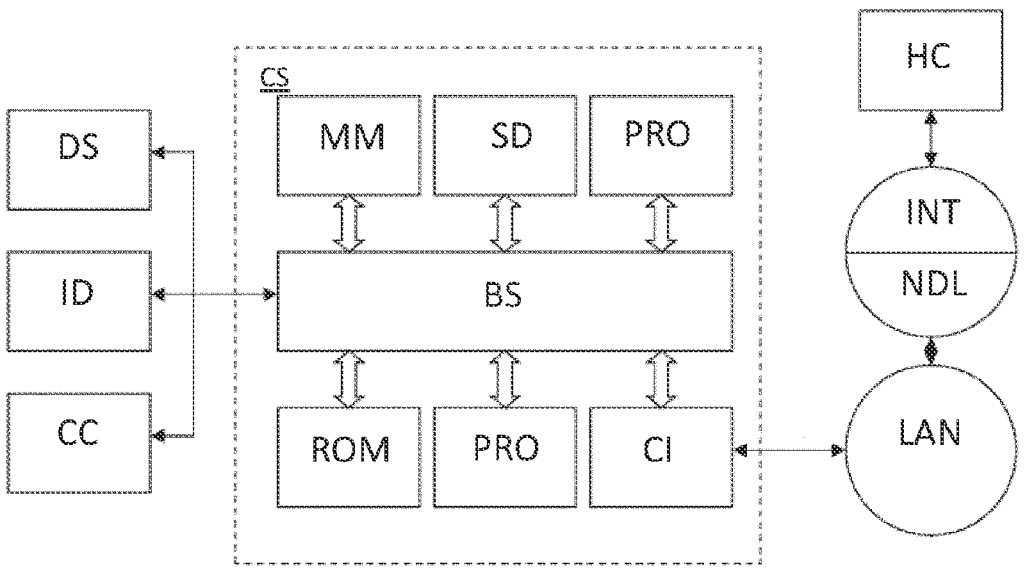
FIG. 9 is a block diagram of an example computer system, according to some embodiments of the present disclosure.

FIG. 9 is a block diagram of an example computer system CS, according to some embodiments.

Computer system CS includes a bus BS or other communication mechanism for communicating information, and a processor PRO (or multiple processor) coupled with bus BS for processing information. Computer system CS also includes a main memory MM, such as a random access memory (RAM) or other dynamic storage device, coupled to bus BS for storing information and instructions to be executed by processor PRO. Main memory MM also may be used for storing temporary variables or other intermediate information during execution of instructions to be executed by processor PRO. Computer system CS further includes a read only memory (ROM) ROM or other static storage device coupled to bus BS for storing static information and instructions for processor PRO. A storage device SD, such as a magnetic disk or optical disk, is provided and coupled to bus BS for storing information and instructions.

Computer system CS may be coupled via bus BS to a display DS, such as a cathode ray tube (CRT) or flat panel or touch panel display for displaying information to a computer user. An input device ID, including alphanumeric and other keys, is coupled to bus BS for communicating information and command selections to processor PRO. Another type of user input device is cursor control CC, such as a mouse, a trackball, or cursor direction keys for communicating direction information and command selections to processor PRO and for controlling cursor movement on display DS. This input device typically has two degrees of freedom in two axes, a first axis (e.g., x) and a second axis (e.g., y), that allows the device to specify positions in a plane. A touch panel (screen) display may also be used as an input device.

According to one example, portions of one or more methods described herein may be performed by computer system CS in response to processor PRO executing one or more sequences of one or more instructions contained in main memory MM. Such instructions may be read into main memory MM from another computer-readable medium, such as storage device SD. Execution of the sequences of instructions contained in main memory MM causes processor PRO to perform the process steps described herein. One or more processors in a multi-processing arrangement may also be employed to execute the sequences of instructions contained in main memory MM. In an alternative example, hard-wired circuitry may be used in place of or in combination with software instructions. Thus, the description herein is not limited to any specific combination of hardware circuitry and software.

The term "computer-readable medium" as used herein refers to any medium that participates in providing instructions to processor PRO for execution. Such a medium may take many forms, including but not limited to, non-volatile media, volatile media, and transmission media. Non-volatile media include, for example, optical or magnetic disks, such as storage device SD. Volatile media include dynamic memory, such as main memory MM. Transmission media include coaxial cables, copper wire and fiber optics, including the wires that comprise bus BS. Transmission media can also take the form of acoustic or light waves, such as those generated during radio frequency (RF) and infrared (IR) data communications. Computer-readable media can be non-transitory, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip, or cartridge. Non-transitory computer readable media can have instructions recorded thereon. The instructions, when executed by a computer, can implement any of the features described herein. Transitory computer-readable media can include a carrier wave or other propagating electromagnetic signal.

Various forms of computer readable media may be involved in carrying one or more sequences of one or more instructions to processor PRO for execution. For example, the instructions may initially be borne on a magnetic disk of a remote computer. The remote computer can load the instructions into its dynamic memory and send the instructions over a telephone line using a modem. A modem local to computer system CS can receive the data on the telephone line and use an infrared transmitter to convert the data to an infrared signal. An infrared detector coupled to bus BS can receive the data carried in the infrared signal and place the data on bus BS. Bus BS carries the data to main memory MM, from which processor PRO retrieves and executes the instructions. The instructions received by main memory MM may optionally be stored on storage device SD either before or after execution by processor PRO.

Computer system CS may also include a communication interface CI coupled to bus BS. Communication interface CI provides a two-way data communication coupling to a network link NDL that is connected to a local network LAN. For example, communication interface CI may be an integrated services digital network (ISDN) card or a modem to provide a data communication connection to a corresponding type of telephone line. As another example, communication interface CI may be a local area network (LAN) card to provide a data communication connection to a compatible LAN. Wireless links may also be implemented. In any such implementation, communication interface CI sends and receives electrical, electromagnetic, or optical signals that carry digital data streams representing various types of information.

Network link NDL typically provides data communication through one or more networks to other data devices. For example, network link NDL may provide a connection through local network LAN to a host computer HC. This can include data communication services provided through the worldwide packet data communication network, now commonly referred to as the "Internet" INT. Local network LAN (Internet) both use electrical, electromagnetic, or optical signals that carry digital data streams. The signals through the various networks and the signals on network data link NDL and through communication interface CI, which carry the digital data to and from computer system CS, are exemplary forms of carrier waves transporting the information.

Computer system CS can send messages and receive data, including program code, through the network(s), network data link NDL, and communication interface CI. In the Internet example, host computer HC might transmit a requested code for an application program through Internet INT, network data link NDL, local network LAN and communication interface CI. One such downloaded application may provide all or part of a method described herein, for example. The received code may be executed by processor PRO as it is received, and/or stored in storage device SD, or other non-volatile storage for later execution. In this manner, computer system CS may obtain application code in the form of a carrier wave.

Figure 10:
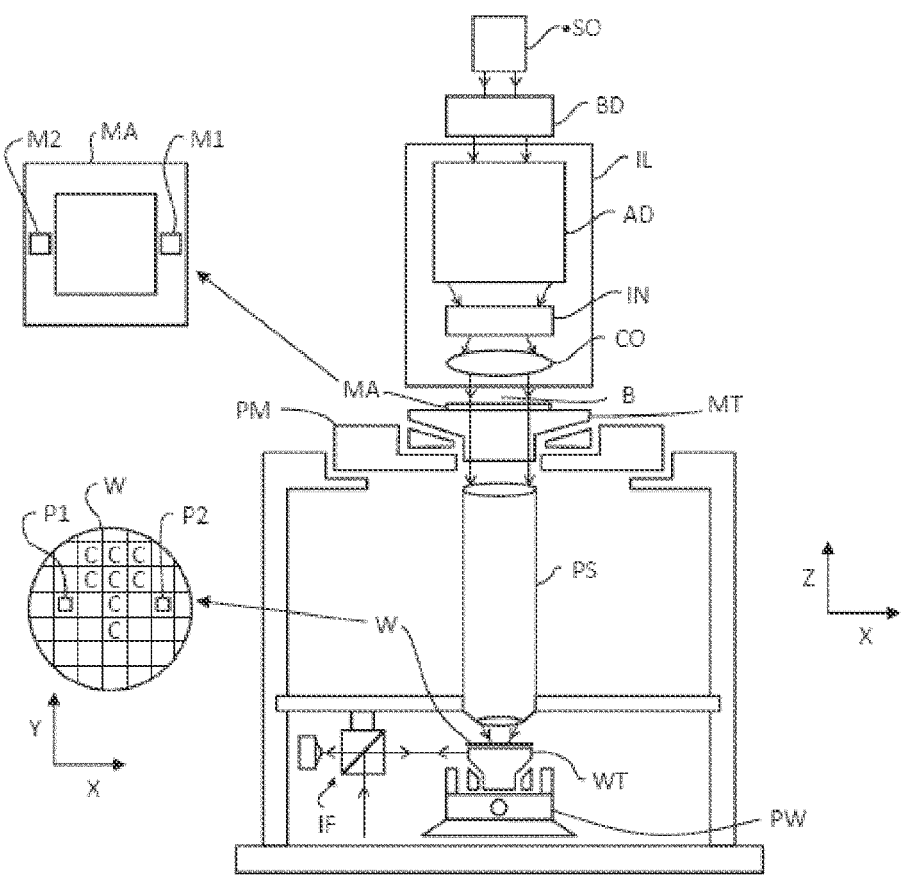
FIG. 10 is a schematic diagram of a lithographic projection apparatus, according to some embodiments of the present disclosure.

FIG. 10 is a schematic diagram of a lithographic projection apparatus, according to some embodiments.

The lithographic projection apparatus can include an illumination system IL, a first object table MT, a second object table WT, and a projection system PS.

Illumination system IL can condition a beam B of radiation. In this particular case, the illumination system also comprises a radiation source SO.

First object table (e.g., patterning device table) MT can be provided with a patterning device holder to hold a patterning device MA (e.g., a reticle), and connected to a first positioner to accurately position the patterning device with respect to item PS.

Second object table (substrate table) WT can be provided with a substrate holder to hold a substrate W (e.g., a resist-coated silicon wafer), and connected to a second positioner to accurately position the substrate with respect to item PS.

Projection system ("lens") PS (e.g., a refractive, catoptric or catadioptric optical system) can image an irradiated portion of the patterning device MA onto a target portion C (e.g., comprising one or more dies) of the substrate W.

As depicted herein, the apparatus can be of a transmissive type (i.e., has a transmissive patterning device). However, in general, it may also be of a reflective type, for example (with a reflective patterning device). The apparatus may employ a different kind of patterning device to classic mask; examples include a programmable mirror array or LCD matrix.

The source SO (e.g., a mercury lamp or excimer laser, LPP (laser produced plasma) EUV source) produces a beam of radiation. This beam is fed into an illumination system (illuminator) IL, either directly or after having traversed conditioning apparatuses, such as a beam expander Ex, for example. The illuminator IL may comprise adjusting device AD for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam B impinging on the patterning device MA has a desired uniformity and intensity distribution in its cross-section.

In some embodiments, source SO may be within the housing of the lithographic projection apparatus (as is often the case when source SO is a mercury lamp, for example), but that it may also be remote from the lithographic projection apparatus, the radiation beam that it produces being led into the apparatus (e.g., with the aid of suitable directing mirrors); this latter scenario can be the case when source SO is an excimer laser (e.g., based on KrF, ArF or F2 lasing).

The beam PB can subsequently intercept patterning device MA, which is held on a patterning device table MT. Having traversed patterning device MA, the beam B can pass through the lens PL, which focuses beam B onto target portion C of substrate W. With the aid of the second positioning apparatus (and interferometric measuring apparatus IF), the substrate table WT can be moved accurately, e.g. so as to position different target portions C in the path of beam PB. Similarly, the first positioning apparatus can be used to accurately position patterning device MA with respect to the path of beam B, e.g., after mechanical retrieval of the patterning device MA from a patterning device library, or during a scan. In general, movement of the object tables MT, WT can be realized with the aid of a long-stroke module (coarse positioning) and a short-stroke module (fine positioning). However, in the case of a stepper (as opposed to a step-and-scan tool) patterning device table MT may just be connected to a short stroke actuator or may be fixed.

The depicted tool can be used in two different modes, step mode and scan mode. In step mode, patterning device table MT is kept essentially stationary, and an entire patterning device image is projected in one go (i.e., a single "flash") onto a target portion C. Substrate table WT can be shifted in the x and/or y directions so that a different target portion C can be irradiated by beam PB.

In scan mode, essentially the same scenario applies, except that a given target portion C is not exposed in a single "flash." Instead, patterning device table MT is movable in a given direction (the so-called "scan direction", e.g., the y direction) with a speed v, so that projection beam B is caused to scan over a patterning device image; concurrently, substrate table WT is simultaneously moved in the same or opposite direction at a speed $V=Mv$, in which M is the magnification of the lens PL (typically, $M=\frac{1}{4}$ or $\frac{1}{5}$). In this manner, a relatively large target portion C can be exposed, without having to compromise on resolution.

Figure 11:
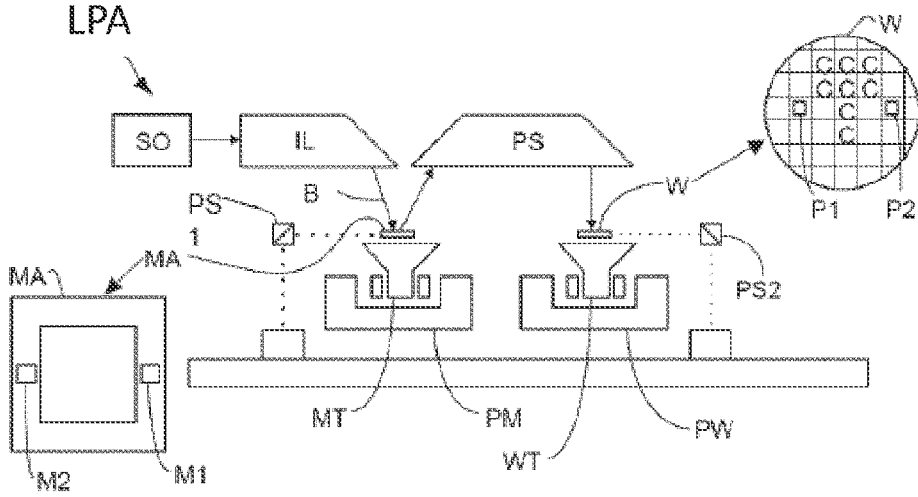
FIG. 11 is a schematic diagram of another lithographic projection apparatus, according to some embodiments of the present disclosure.

FIG. 11 is a schematic diagram of another lithographic projection apparatus (LPA), according to some embodiments.

LPA can include source collector module SO, illumination system (illuminator) IL configured to condition a radiation beam B (e.g. EUV radiation), support structure MT, substrate table WT, and projection system PS.

Support structure (e.g. a patterning device table) MT can be constructed to support a patterning device (e.g. a mask or a reticle) MA and connected to a first positioner PM configured to accurately position the patterning device;

Substrate table (e.g. a wafer table) WT can be constructed to hold a substrate (e.g. a resist coated wafer) W and connected to a second positioner PW configured to accurately position the substrate.

Projection system (e.g. a reflective projection system) PS can be configured to project a pattern imparted to the radiation beam B by patterning device MA onto a target portion C (e.g. comprising one or more dies) of the substrate W.

As here depicted, LPA can be of a reflective type (e.g. employing a reflective patterning device). It is to be noted that because most materials are absorptive within the EUV wavelength range, the patterning device may have multi-layer reflectors comprising, for example, a multi-stack of molybdenum and silicon. In one example, the multi-stack reflector has a 40 layer pairs of molybdenum and silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Illuminator IL can receive an extreme ultra violet radiation beam from source collector module SO. Methods to produce EUV radiation include, but are not necessarily limited to, converting a material into a plasma state that has at least one element, e.g., xenon, lithium, or tin, with one or more emission lines in the EUV range. In one such method, often termed laser produced plasma ("LPP") the plasma can be produced by irradiating a fuel, such as a droplet, stream or cluster of material having the line-emitting element, with a laser beam. Source collector module SO may be part of an EUV radiation system including a laser for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser may not be considered to form part of the lithographic apparatus and the radiation beam can be passed from the laser to the source collector module with the aid of a beam delivery system comprising, for example, suitable directing mirrors and/or a beam expander. In other cases, the source may be an integral part of the source collector module, for example when the source is a discharge produced plasma EUV generator, often termed as a DPP source.

Illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B can be incident on the patterning device (e.g., mask) MA, which is held on the support structure (e.g., patterning device table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder, or capacitive sensor), the substrate table WT can be moved accurately, e.g. so as to position different target portions C in the path of radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus LPA could be used in at least one of the following modes, step mode, scan mode, and stationary mode.

In step mode, the support structure (e.g. patterning device table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

In scan mode, the support structure (e.g. patterning device table) MT and the substrate table WT are scanned synchronously while a pattern imparted to the radiation beam is projected onto target portion C (i.e. a single dynamic exposure). The velocity and direction of substrate table WT relative to the support structure (e.g. patterning device table) MT may be determined by the (de-) magnification and image reversal characteristics of the projection system PS.

In stationary mode, the support structure (e.g. patterning device table) MT is kept essentially stationary holding a programmable patterning device, and substrate table WT is moved or scanned while a pattern imparted to the radiation beam is projected onto a target portion C. In this mode, generally a pulsed radiation source is employed, and the programmable patterning device is updated as required after each movement of the substrate table WT or in between successive radiation pulses during a scan. This mode of operation can be readily applied to maskless lithography that utilizes programmable patterning device, such as a programmable mirror array.

Figure 12:
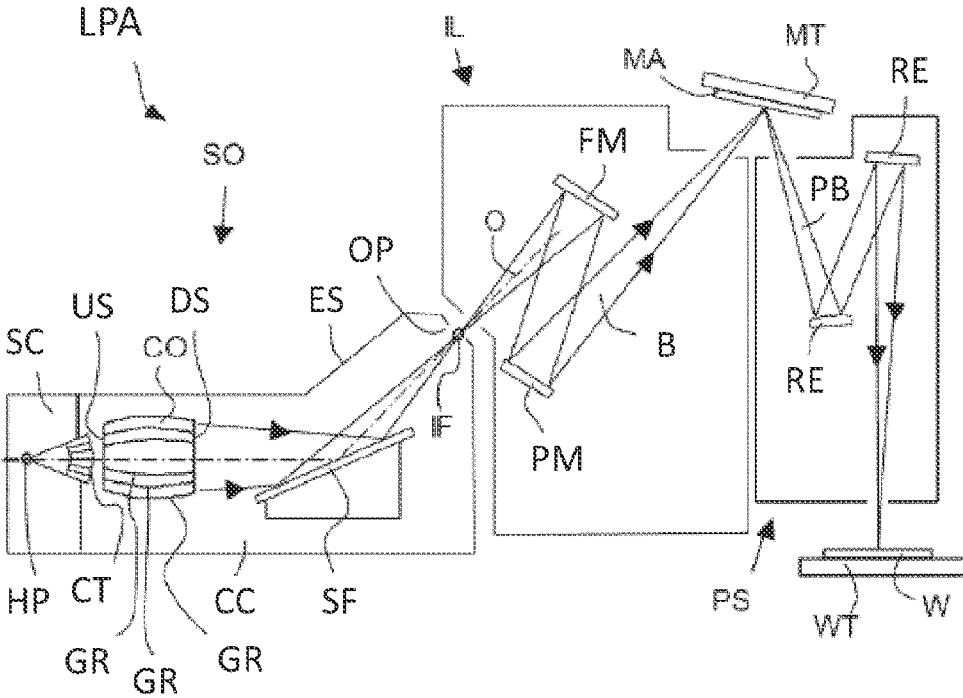
FIG. 12 is a detailed view of the lithographic projection apparatus, according to some embodiments of the present disclosure.

FIG. 12 is a detailed view of the lithographic projection apparatus, according to some embodiments.

As shown, LPA can include the source collector module SO, the illumination system IL, and the projection system PS. The source collector module SO is constructed and arranged such that a vacuum environment can be maintained in an enclosing structure ES of the source collector module SO. An EUV radiation emitting hot plasma HP may be formed by a discharge produced plasma source. EUV radiation may be produced by a gas or vapor, for example Xe gas, Li vapor or Sn vapor in which the hot plasma HP is created to emit radiation in the EUV range of the electromagnetic spectrum. The hot plasma HP is created by, for example, an electrical discharge causing at least partially ionized plasma. Partial pressures of, for example, 10 Pa of Xe, Li, Sn vapor or any other suitable gas or vapor may be required for efficient generation of the radiation. In some embodiments, a plasma of excited tin (Sn) is provided to produce EUV radiation.

The radiation emitted by the hot plasma HP is passed from a source chamber SC into a collector chamber CC via an optional gas barrier or contaminant trap CT (in some cases also referred to as contaminant barrier or foil trap) which is positioned in or behind an opening in source chamber SC. The contaminant trap CT may include a channel structure. Contamination trap CT may also include a gas barrier or a combination of a gas barrier and a channel structure. The contaminant trap or contaminant barrier CT further indicated herein at least includes a channel structure, as known in the art.

The collector chamber CC may include a radiation collector CO which may be a so-called grazing incidence collector. Radiation collector CO has an upstream radiation collector side US and a downstream radiation collector side DS. Radiation that traverses radiation collector CO can be reflected off a grating spectral filter SF to be focused in a virtual source point IF along the optical axis indicated by the dot-dashed line 'O'. The virtual source point IF can be referred to as the intermediate focus, and the source collector module can be arranged such that the intermediate focus IF is located at or near an opening OP in the enclosing structure ES. The virtual source point IF is an image of the radiation emitting plasma HP.

Subsequently the radiation traverses the illumination system IL, which may include a facetted field mirror device FM and a facetted pupil mirror device pm arranged to provide a desired angular distribution of the radiation beam B, at the patterning device MA, as well as a desired uniformity of radiation amplitude at the patterning device MA. Upon reflection of the beam of radiation B at the patterning device MA, held by the support structure MT, a patterned beam PB is formed and the patterned beam PB is imaged by the projection system PS via reflective elements RE onto a substrate W held by the substrate table WT.

More elements than shown may generally be present in illumination optics unit IL and projection system PS. The grating spectral filter SF may optionally be present, depending upon the type of lithographic apparatus. Further, there may be more mirrors present than those shown in the figures, for example there may be 1-6 additional reflective elements present in the projection system PS.

Collector optic CO can be a nested collector with grazing incidence reflectors GR, just as an example of a collector (or collector mirror). The grazing incidence reflectors GR are disposed axially symmetric around the optical axis O and a collector optic CO of this type may be used in combination with a discharge produced plasma source, often called a DPP source.

Figure 13:
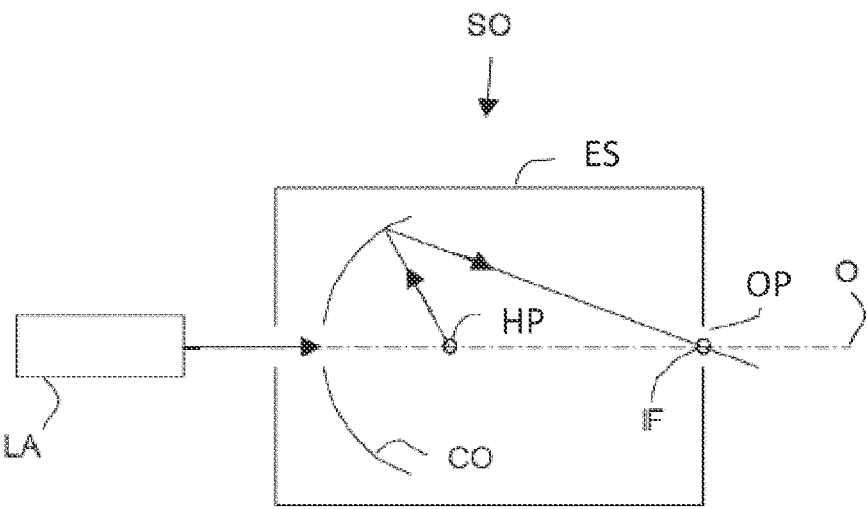
FIG. 13 is a detailed view of the source collector module of the lithographic projection apparatus, according to some embodiments of the present disclosure.

FIG. 13 is a detailed view of source collector module SO of lithographic projection apparatus LPA, according to some embodiments.

Source collector module SO may be part of an LPA radiation system. A laser LA can be arranged to deposit laser energy into a fuel, such as xenon (Xe), tin (Sn) or lithium (Li), creating the highly ionized plasma HP with electron temperatures of several 10's of eV. The energetic radiation generated during de-excitation and recombination of these ions is emitted from the plasma, collected by a near normal incidence collector optic CO and focused onto the opening OP in the enclosing structure ES.

The concepts disclosed herein may simulate or mathematically model any generic imaging system for imaging sub wavelength features and may be especially useful with emerging imaging technologies capable of producing increasingly shorter wavelengths. Emerging technologies already in use include EUV (extreme ultra violet), DUV lithography that is capable of producing a 193 nm wavelength with the use of an ArF laser, and even a 157 nm wavelength with the use of a Fluorine laser. Moreover, EUV lithography is capable of producing wavelengths within a range of 20-50 nm by using a synchrotron or by hitting a material (either solid or a plasma) with high energy electrons in order to produce photons within this range.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The combinations and sub-combinations of the elements disclosed herein constitute separate embodiments and are provided as examples only. Also, the descriptions above are intended to be illustrative, not limiting. Thus, it will be apparent to one skilled in the art that modifications may be made as described without departing from the scope of the claims set out below.

Further embodiments are disclosed in the subsequent list of numbered clauses:

1. A system comprising: an optical column; a frame configured to support the optical column, the frame having a first coefficient of thermal expansion (CTE); and a subframe configured to be coupled to the optical column in at least two places by a first anchor and a second anchor to stabilize the optical column against a displacement or a rotation caused by thermal expansion in the frame or the optical column, the subframe having a second CTE lower than the first CTE.

2. The system of any of the preceding clauses, wherein the optical column is suspended under a lateral frame section of the frame at a distal end of the optical column and the subframe is coupled to the optical column at a proximal end of the optical column.

3. The system of any of the preceding clauses, wherein the subframe is coupled to the optical column at approximately a level of a micro-lens array located in the optical column.

4. The system of any of the preceding clauses, wherein the frame is primarily made of steel having a CTE of approximately 14 μm/m/K.

5. The system of any of the preceding clauses, wherein the subframe is primarily made of cordierite having a CTE of approximately 0.03 μm/m/K.

6. The system of any of the preceding clauses, wherein the first anchor and the second anchor are configured to couple to the subframe and the optical column to stabilize the optical column against the displacements in a plane and against the rotation around a longitudinal axis through the optical column perpendicular to the plane.

7. The system of any of the preceding clauses, wherein the displacement is no more than 10 microns meters in a plane and the rotation is no more than 10 micro-radians around a longitudinal axis through the optical column perpendicular to the plane.

8. The system of any of the preceding clauses, further comprising: a plurality of optical columns; and a plurality of first anchors and a plurality of second anchors, each of the plurality of the first and second anchors coupled to a corresponding optical column in the plurality of the optical columns.

9. The system of any of the preceding clauses, wherein the first anchor is configured to stabilize against the displacement of the optical column in at least two directions perpendicular to an axis of the optical column.

10. The system of any of the preceding clauses, wherein the first anchor extends at least partially in a first direction of the two directions and extends at least partially in a second direction of the two directions.

11. The system of any of the preceding clauses, wherein the first anchor is approximately centered on a side of the optical column.

12. The system of any of the preceding clauses, wherein the second anchor is coupled to the optical column at a different location than the first anchor, thereby resisting the rotation of the optical column around a longitudinal axis.

13. The system of any of the preceding clauses, the subframe further comprising a third anchor, wherein the coupling in the at least two places is performed by the first anchor and further by the third anchor.

14. The system of any of the preceding clauses, wherein the first anchor and the third anchor are coupled to the optical column at a same location.

15. The system of any of the preceding clauses, wherein the third anchor is configured to stabilize against the displacement of the optical column being in at least two directions perpendicular to a longitudinal axis of the optical column, wherein the third anchor extends at least partially opposite a first direction of the two directions and extends at least partially in a second direction of the two directions.

16. The system of any of the preceding clauses, wherein the first anchor, the second anchor, and the third anchor are all on a side of the subframe.

17. The system of any of the preceding clauses, the subframe further comprising a first lateral subframe section, the first anchor and the second anchor coupled to the first lateral subframe section.

18. The system of any of the preceding clauses, further comprising a release mechanism allowing disassembly of the first lateral subframe section from a second lateral subframe section of the subframe.

19. The system of any of the preceding clauses, the frame further comprising two frame vertical sections symmetrically located at opposing ends of a lateral frame section to allow positioning of the optical column between them, wherein the subframe is coupled to the two vertical frame sections thereby causing the subframe to be centered with the frame.

20. The system of any of the preceding clauses, wherein the subframe is configured to be coupled to an external body to resist a vertical displacement.

21. The system of any of the preceding clauses, further comprising a Z actuator coupled to the optical column and configured to compensate for a vertical displacement of the optical column.

22. The system of any of the preceding clauses, wherein the system is configured to manufacture flat-panel displays.

23. A method for stabilizing an optical column against a displacement or a rotation, the method comprising: supporting an optical column with a frame having a first coefficient of thermal expansion (CTE); and coupling the optical column to a subframe in at least two places by a first anchor and a second anchor to stabilize the optical column against a displacement or a rotation caused by thermal expansion in the frame or the optical column, the subframe having a second CTE lower than the first CTE.

24. The method of any of the preceding method clauses, the method further comprising utilizing the first anchor and the second anchor to stabilize the optical column against the displacements in a plane and against the rotation around a longitudinal axis through the optical column perpendicular to the plane.

25. The method of any of the preceding method clauses, the method further comprising coupling the subframe to the optical column at approximately a level of a micro-lens array located in the optical column.

26. The method of any of the preceding method clauses, the method further comprising coupling the second anchor to the optical column at a different location than the first anchor, thereby resisting the rotation of the optical column around a longitudinal axis.

27. The method of any of the preceding method clauses, the method further comprising coupling a third anchor to the subframe, wherein the coupling in the at least two places is performed by the first anchor and further by the third anchor.

The invention claimed is:

1. A system comprising:
   an optical column;
   a frame configured to support the optical column, the frame having a first coefficient of thermal expansion (CTE), wherein the optical column is suspended under a lateral frame section of the frame at a distal end of the optical column; and
   a subframe configured to be coupled to the optical column in at least two places by a first anchor and a second anchor to stabilize the optical column against a displacement or a rotation caused by thermal expansion in the frame or the optical column, the subframe having a second CTE lower than the first CTE.

2. The system of claim 1, wherein and the subframe is coupled to the optical column at a proximal end of the optical column.

3. The system of claim 1, wherein the subframe is coupled to the optical column at approximately a level of a micro-lens array located in the optical column.

4. The system of claim 1, wherein the first anchor and the second anchor are configured to couple to the subframe and the optical column to stabilize the optical column against displacements in a plane and against the rotation around a longitudinal axis through the optical column perpendicular to the plane.

5. The system of claim 1, further comprising:
   a plurality of optical columns; and
   a plurality of first anchors and a plurality of second anchors, each of the plurality of the first and second anchors coupled to a corresponding optical column in the plurality of the optical columns.

6. The system of claim 1, wherein the first anchor is configured to stabilize against the displacement of the optical column in at least two directions perpendicular to an axis of the optical column.

7. The system of claim 1, wherein the second anchor is coupled to the optical column at a different location than the first anchor, thereby resisting the rotation of the optical column around a longitudinal axis.

8. The system of claim 1, wherein the subframe further comprises a third anchor, wherein the coupling in the at least two places is performed by the first anchor and further by the third anchor.

9. The system of claim 8, wherein the third anchor is configured to stabilize against the displacement of the optical column being in at least two directions perpendicular to a longitudinal axis of the optical column, wherein the third anchor extends at least partially opposite a first direction of the two directions and extends at least partially in a second direction of the two directions.

10. The system of claim 1, wherein the subframe further comprises a first lateral subframe section, the first anchor and the second anchor coupled to the first lateral subframe section.

11. The system of claim 1, wherein the frame further comprises two frame vertical sections symmetrically located at opposing ends of a lateral frame section to allow positioning of the optical column between them, wherein the subframe is coupled to the two vertical frame sections thereby causing the subframe to be centered with the frame.

12. The system of claim 1, wherein the subframe is configured to be coupled to an external body to resist a vertical displacement.

13. The system of claim 1, further comprising a Z actuator coupled to the optical column and configured to compensate for a vertical displacement of the optical column.

14. The system of claim 1, wherein the system is configured to manufacture flat-panel displays.

15. A method for stabilizing an optical column against a displacement or a rotation, the method comprising:

supporting an optical column with a frame having a first coefficient of thermal expansion (CTE), wherein the optical column is suspended under a lateral frame section of the frame at a distal end of the optical column; and coupling the optical column to a subframe in at least two places by a first anchor and a second anchor to stabilize the optical column against a displacement or a rotation caused by thermal expansion in the frame or the optical column, the subframe having a second CTE lower than the first CTE.

16. The method of claim 15, further comprising utilizing the first anchor and the second anchor to stabilize the optical column against displacements in a plane and against the rotation around a longitudinal axis through the optical column perpendicular to the plane.

17. The method of claim 15, further comprising coupling the subframe to the optical column at approximately a level of a micro-lens array located in the optical column.

18. The method of claim 15, further comprising coupling the second anchor to the optical column at a different location than the first anchor, thereby resisting the rotation of the optical column around a longitudinal axis.

19. The method of claim 15, further comprising coupling a third anchor to the subframe, wherein the coupling in the at least two places is performed by the first anchor and further by the third anchor.

\* \* \* \* \*